United States Patent [19]
Abbott et al.

[11] Patent Number: 5,264,376
[45] Date of Patent: Nov. 23, 1993

[54] METHOD OF MAKING A THIN FILM SOLAR CELL

[75] Inventors: Donald C. Abbott, Norton, Mass.; Bawa S. Mohendra, Plano, Tex.; Raymond A. Frechette, North Providence, R.I.

[73] Assignee: Texas Instruments Incorporated, Dallas, Tex.

[21] Appl. No.: 719,902

[22] Filed: Jun. 24, 1991

[51] Int. Cl.⁵ .................................... H01L 31/18
[52] U.S. Cl. .................................... 437/5; 437/2; 437/3; 437/4; 136/256
[58] Field of Search ............... 437/2, 3, 4, 5, ; 427/34, 35, 37, 77, 78, 99, 282, 422, 426; 136/258, 256, 244

[56] References Cited

U.S. PATENT DOCUMENTS

| | | | |
|---|---|---|---|
| 4,606,929 | 8/1986 | Petrakov et al. | 427/34 |
| 4,704,306 | 11/1987 | Nakamura | 427/282 |
| 4,715,940 | 12/1987 | Boudreau | 427/282 |
| 4,828,870 | 5/1989 | Ando et al. | 427/99 |
| 4,988,424 | 1/1991 | Woodward et al. | 427/282 |
| 5,039,547 | 8/1991 | Jung | 427/77 |
| 5,066,513 | 11/1991 | Zurecki et al. | 427/34 |
| 5,124,269 | 6/1992 | Kobayashi et al. | 136/258 |
| 5,144,110 | 9/1992 | Marantz et al. | 427/34 |

*Primary Examiner*—Brian E. Hearn
*Assistant Examiner*—Kevin M. Picardat
*Attorney, Agent, or Firm*—John D. Kaufmann; James C. Kesterson; Richard L. Donaldson

[57] ABSTRACT

A method is provided of making a thin film solar cell comprising depositing solar cell material on a substrate using an ionized gas stream for transporting and applying solar cell material to the substrate.

24 Claims, 1 Drawing Sheet

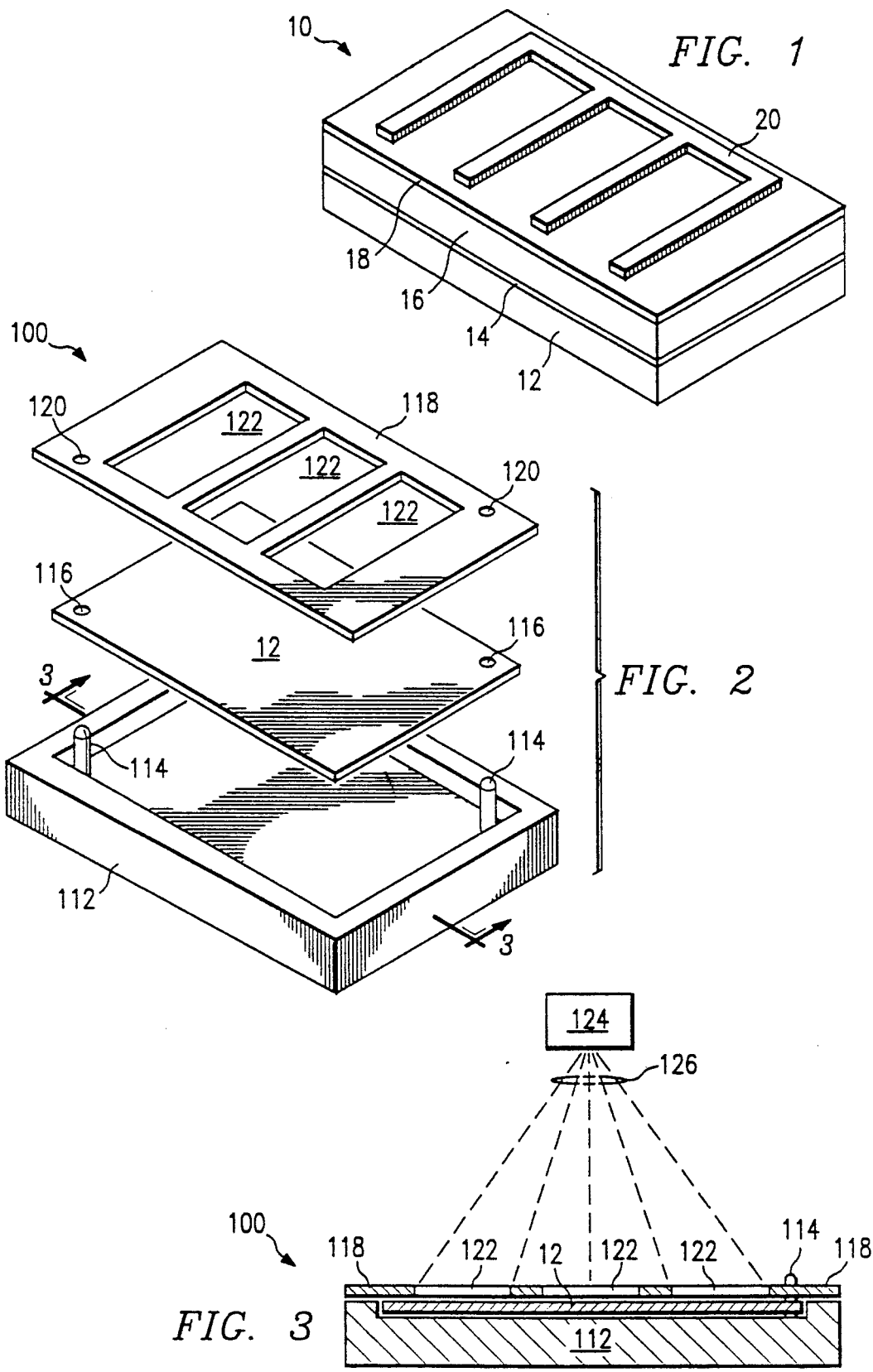

METHOD OF MAKING A THIN FILM SOLAR CELL

TECHNICAL FIELD OF THE INVENTION

This application relates generally to photovoltaic solar cells. More particularly, it relates to a method of making thin film solar cells.

BACKGROUND OF THE INVENTION

Photovoltaic solar cells convert light energy into electricity. Because solar cells are nonpolluting and solar energy is abundant, solar cells are an extremely attractive source of electricity. However, before widescale use can be made of solar cells, their cost must be reduced to make them economically competitive with conventional sources of electricity.

Solar cells are typically made from solid wafers of solar cell material like silicon. Because silicon and other solar cell materials are expensive, one method of reducing the cost of solar cells is to use less solar cell material by applying a thin film of the material on a substrate. Present methods for applying a thin film of solar cell material on a substrate, like chemical vapor deposition, are typically high temperature processes. For example, chemical vapor deposition is usually performed at temperatures above 1,000° C. When using such a process, the temperature of the substrate is raised to the deposition temperature. Consequently, these processes limit the types of substrate materials that can be used for making solar cells. For instance, while quartz and glass, which can withstand high temperatures, may be suitable as substrate material, other less expensive materials like plastics may be unsuitable.

An additional problem with present methods of making thin film solar cells is that they do not provide effective means for selective deposition of solar cell and electrical contact material. As solar cells can be designed to be intricately connected with other solar cells, a method of selectively coating the substrate should be provided to facilitate the connections.

Thus, a need has arisen for a method of applying solar cell and electrical contact material on substrates that does not substantially raise the temperature of the substrates, thereby allowing use of a wide range of substrate materials, including inexpensive plastics. Further, there is a need for an effective method for selectively depositing solar cell and electrical contact material on substrates to allow intricate connections between solar cells.

SUMMARY OF THE INVENTION

A method is provided for making a thin film solar cell comprising depositing coating material including solar cell and contact material on a substrate using an ionized gas stream for transporting and applying the coating material to the substrate.

A technical advantage of the method disclosed herein for making thin film solar cells is that the method comprises a process that does not require the substrate to be raised to the temperature of the coating material. Consequently, a wide range of materials, including those having low melting temperatures like plastics, may be used in the solar cell.

Another technical advantage of the method disclosed herein for making thin film solar cells is that the method enables selective deposition of coating material on portions of the solar cell to facilitate intricate connections with other solar cells.

A further technical advantage of the method disclosed herein is that the method enables a thin film solar cell to be made from substrates having a variety of geometric forms or shapes including flat or spherical substrates.

BRIEF DESCRIPTION OF THE DRAWINGS

The foregoing and additional objects and advantages of the invention will become more apparent as the following detailed description is read in conjunction with the accompanying drawings, wherein like reference characters denote like parts in all views and wherein:

FIG. 1 is a three-dimensional view of a thin film solar cell;

FIG. 2 is an exploded view of a mask and fixture assembly that can be used for making thin film solar cells; and FIG. 3 is a cross-sectional view of the mask and fixture assembly taken generally along section line 3—3 of FIG. 2 as it is used with a plasma gun for depositing solar cell and electrical contact material on a substrate.

DETAILED DESCRIPTION OF THE INVENTION

FIG. 1 is a three-dimensional view of a thin film solar cell generally indicated by reference character 10 that can be made by the method disclosed herein. The solar cell 10 includes an underlying layer of substrate material 12, which is covered by a layer of metallized material, forming a back contact 14. The back contact 14 is covered by a p-type layer 16 of solar cell material. The p-type layer 16 is, in turn, covered by an n-type layer 18 of solar cell material. The n-type layer 18 is partially covered by a front contact 20.

The substrate 12 may comprise a wide range of materials. As the method for making solar cells disclosed herein does not substantially raise the substrate temperature, materials with generally low melting temperatures may be used as substrates. The substrate 12 may thus comprise both materials with high melting temperatures like quartz and glass, as well as less expensive materials having relatively low melting temperatures like plastics.

The back contact 14 may comprise a variety of electrically conductive materials including, for example, aluminum. The back contact 14 may entirely cover the substrate 12 or only selective portions of the substrate 12 to facilitate connection of the solar cell 10 to other solar cells.

Similarly, the p-type layer 16 may completely or only selectively cover the back contact 14. The n-type layer 18 may also completely or only selectively cover the p-type layer 16.

The solar cell material used for the p-type and n-type layers 16 and 18 may comprise silicon or a variety of other solar cell materials including, for example, gallium arsenide and silicon carbide.

The front contact 20 is applied to the upper surface of the n-type layer 18. The front contact 20 may comprise a variety of shapes to minimize resistance losses and to facilitate connections with other solar cells. The front contact 20 does not completely cover the n-type layer ; as light must be allowed to reach the n-type layer 18 when the solar cell 10 is in use. Like the back contact 14, the front contact 20 may be made from a number of electrically conductive materials including, for example, aluminum.

Although not shown, it should be noted that the back contact 14 need not be applied to the substrate 12 as a layer; the back contact 14 may comprise a wire attached to a side of the p-type layer 16. Similarly, the front contact 20 may comprise a wire attached to a side of the n-type layer 18.

Although not shown, the back and front contacts 14 and 20 may extend away from the remainder of the solar cell 10. In this case, a layer of dielectric material may be positioned between the contacts 14 and 20.

For simplicity, FIG. 1 shows the various layers 12, 14, 16, 18 and 20 as planar layers. It should be noted that any or all of the layers 12, 14, 16, 18 and 20 may comprise three dimensional contoured shapes to increase or enhance the solar cell surface area and light collection effectiveness.

FIG. 2 is an exploded view of a mask and fixture assembly generally indicated at 100, which can be used for making thin film solar cells. The assembly 100 includes a base fixture member 112. The fixture 112 includes two projecting index pins 114 located near opposite corners of the fixture 112. When the assembly 100 is to be used, the substrate 12 is held in the fixture 112. The substrate 12 is provided with two index holes 116 to mate with the index pins 114. The index pin-hole combination allows the substrate 12 to be held firmly in place.

A mask 118 is positioned slightly above the substrate 12. The mask 118 also includes a pair of index holes 120, which are located on the mask 118 so that they can mate with the index pins 114 to allow proper alignment of the mask 118 with respect to the substrate 12. The mask 118 may comprise a variety of materials including metals, plastics and cardboard.

The mask 118 shown in FIG. 2 includes three windows 122, which allow selective deposition of solar cell or electrical contact material on the substrate 12. The configuration of the windows 122 shown in FIG. 2 is provided only as an example of a window configuration. Masks having different window configurations can be used successively for each layer of material deposited as required by the solar cell design.

The assembly 100 shown in FIG. 2 can be used for solar cells having a flat or contoured rectangular substrate. It should be noted that the assembly 100 can be modified (not shown) to hold flat or contoured substrates having any geometric shape. In addition, the fixture 100 may be modified (not shown) to include holding means for holding non-flat substrates like spherical substrates. Additionally, spherical substrates may be used without specific mask fixturing.

FIG. 3 is a cross-sectional view of the assembly 100 taken generally along the section line 3—3 of FIG. 2 along with a plasma gun 124 for depositing solar cell and contact material on the substrate 12.

In operation, the substrate 12 is first placed in the fixture and mask assembly 100 with the index pins 114 mated with their respective index holes 116 and 120. Then successive layers of contact and solar cell material are deposited on the substrate by the plasma gun 124. The solar cell shown in FIG. 1 is an example of a cell that may be made using this method. For each layer of either solar cell material or contact material that is deposited by the plasma gun 124 on the substrate 12, a different mask may be required for selective deposition of the material. In the event the entire surface of the substrate is to be coated with material, the mask 118 may be entirely removed.

The plasma gun 124 utilizes a plasma or an ionized gas for transporting and depositing material on the substrate 12. A plasma supporting gas (like argon) is continually supplied to the gun 124 during its operation. In the gun 124, the gas is passed through a high voltage arc, causing it to become ionized. Ionization of the plasma supporting gas may alternatively be caused by applying microwave energy to the gas. Ionization of the gas substantially raises the gas temperature.

The plasma or ionized gas is then mixed with a coating material, which can be solar cell or contact material. The coating material, which is preferably in a fine powder form, is injected into the ionized gas at the gun outlet. As the ionized gas exits the gun in a gas stream 126, it becomes un-ionized, releasing heat, which melts the coating material. The gas stream 126 melts and simultaneously transports the coating material to the substrate 12. When the coating material strikes the substrate 12, it cools rapidly upon impact. Rapid cooling occurs because the coating material comprises fine particles, which possess little thermal mass. Consequently, there is no substantial heating of the substrate, which allows a variety of materials to be used for the substrate 12.

The coating process described above when used to deposit solar cell material, should be performed in an inert or reducing atmosphere, particularly in the vicinity of the substrate to inhibit oxidation of the solar cell material.

The plasma supporting gas used in the plasma gun 124 may be argon or any other gas that supports plasma formation. The other suitable gases include nitrogen and hydrogen.

It should be noted that the back and front contacts need not be applied to the solar cell as layers, but may be attached to the sides of the p and n-type layers, respectively. If the solar cell is designed to have contacts that extend away from the rest of the solar cell, a layer of dielectric material may be deposited by a variety of means between the contacts.

A technical advantage of the method disclosed herein for making thin film solar cells is that the method comprises a process that does not require the substrate to be raised to the temperature of the coating material. Consequently, a wider range of materials, including those having low melting temperatures like plastics, may be used in the solar cell.

Another technical advantage of the method disclosed herein for making thin film solar cells is that the method enables selective deposition of coating material on portions of the solar cell to facilitate intricate connections with other solar cells.

A further technical advantage of the method disclosed herein is that the method enables a solar cell to be made of substrates having a variety of geometric forms or shapes including flat or spherical substrates.

Although the present invention has been described with respect to specific embodiments, it should be understood that various changes, substitutions and alterations can be made hereto without departing from the spirit and scope of the invention as defined by the appended claims.

What is claimed is:

1. A method of making a thin film solar cell, comprising the steps of:

depositing a layer of contact material on a substrate to form a back contact using a plasma gun to generate an ionized gas stream for heating and discharging the contact material;

depositing a layer of p-type solar cell material on the back contact using a plasma gun to generate an ionized gas stream for heating and discharging the p-type solar cell material;

depositing a layer of n-type solar cell material on the layer of p-type solar cell material using a plasma gun to generate an ionized gas stream for heating and discharging the n-type solar cell material; and depositing a layer of contact material on the layer of n-type solar cell material to form a front contact using a plasma gun to generate an ionized gas stream for heating and discharging the contact material.

2. The method of claim 1, wherein said step of depositing a layer of p-type solar cell material comprises depositing a layer of p-type silicon and wherein said step of depositing a layer of n-type solar cell material comprises depositing a layer of n-type silicon.

3. The method of claim 1, wherein said step of depositing a layer of contact material on the layer of n-type solar cell material comprises selectively depositing the layer of contact material on the layer of n-type solar cell material.

4. The method of claim 3, wherein said step of selectively depositing the layer of contact material on the layer of n-type solar cell material comprises depositing the layer of contact material on the layer of n-type solar cell material using a mask to block a portion of the ionized gas stream.

5. The method of claim 4, wherein said mask is aligned with said substrate.

6. The method of claim 5, wherein said mask is aligned with said substrate by forming a first index hole in the mask and forming a second index hole in the substrate and inserting an index pin through said first index hole and said second index hole.

7. The method of claim 1, wherein said back contact material comprises Aluminum.

8. The method of claim 1, wherein said p-type solar cell material and said n-type polar cell material are generally in a powdered form.

9. The method of claim 1, wherein said step of depositing a layer of contact material on a substrate occurs in a generally inert atmosphere.

10. The method of claim 1, wherein said step of depositing a layer of p-type solar cell material on the back contact occurs in a generally inert atmosphere.

11. The method of claim 1, wherein said step of depositing a layer of n-type solar cell material on the layer of p-type solar cell material occurs in a generally inert atmosphere.

12. A method of making a thin silicon film solar cell, comprising:

depositing a layer of back contact material on a substrate using a plasma gun to melt and transport the back contact material to the substrate;

depositing a layer of p-type silicon on the layer of back contact material using a plasma gun to melt and transport the p-type silicon to the layer of back contact material;

depositing a layer of n-type silicon on the layer of p-type silicon using a plasma gun to metal and transport the n-type silicon to the layer of p-type silicon; and depositing a layer of front contact material on selective portions of the layer of n-type silicon using a plasma gun to metal and transport the front contact material to the layer of n-type silicon.

13. The method of claim 12, wherein said step of depositing a layer of contact material on the layer of n-type solar cell material occurs in a generally inert atmosphere.

14. The method of claim 12, wherein said ionized gas stream is comprised of gas chosen from the group consisting of argon, nitrogen, hydrogen, a combination of any two, or a combination of all three.

15. The method of claim 12, wherein said back contact material comprises Aluminum.

16. The method of claim 12, wherein said p-type silicon and said n-type silicon are generally in a powdered form.

17. The method of claim 12, wherein said step of depositing a layer of back contact material on a substrate occurs in a generally inert atmosphere.

18. The method of claim 12, wherein said step of depositing a layer of p-type silicon on a layer of back contact material on a substrate occurs in a generally inert atmosphere.

19. The method of claim 12, wherein said step of depositing a layer of n-type silicon on a layer of p-type silicon occurs in a generally inert atmosphere.

20. The method of claim 12, wherein said step of depositing a layer of front contact material on selective portions of the layer of n-type silicon occurs in a generally inert atmosphere.

21. The method of claim 12, wherein said plasma gun utilizes ionized gas, wherein said ionized gas is chosen from the group consisting of argon, nitrogen, hydrogen, a combination of any two, or a combination of all three.

22. The method of claim 12, wherein said step of depositing a layer of front contact material on selective portions of the layer of n-type silicon comprises positioning a mask between the plasma gun and the substrate.

23. The method of claim 22, wherein said mask is aligned with said substrate.

24. The method of claim 22, wherein said mask is aligned with said substrate by forming a first index hole in the mask and forming a second index hole in the substrate and inserting an index pin through said first index hole and said second index hole.

* * * * *